US008154339B2

(12) United States Patent
Zolghadri et al.

(10) Patent No.: US 8,154,339 B2
(45) Date of Patent: Apr. 10, 2012

(54) V-BAND HIGH-POWER TRANSMITTER WITH INTEGRATED POWER COMBINER

(75) Inventors: Mohsen Zolghadri, Newport Beach, CA (US); Farrokh Mohamadi, Newport Beach, CA (US)

(73) Assignee: Tialinx, Inc., Newport Beach, CA (US)

( * ) Notice: Subject to any disclaimer, the term of this patent is extended or adjusted under 35 U.S.C. 154(b) by 159 days.

(21) Appl. No.: 12/629,001

(22) Filed: Dec. 1, 2009

(65) Prior Publication Data
US 2011/0068865 A1    Mar. 24, 2011

Related U.S. Application Data

(60) Provisional application No. 61/245,106, filed on Sep. 23, 2009.

(51) Int. Cl.
*H03F 3/68* (2006.01)
(52) U.S. Cl. ............ 330/124 R; 330/149; 330/295
(58) Field of Classification Search ........... 330/124 R, 330/149, 295; 455/114.3
See application file for complete search history.

(56) References Cited

U.S. PATENT DOCUMENTS
7,119,621 B2 * 10/2006 Chen et al. ............. 330/295

OTHER PUBLICATIONS

F.Mohamadi, Project: IEEE P.802.15 Working Group for Wireless Personal Area Networks (WPANs), IEEE Symposium, 2005, Irvine, CA.
Anderei Grebennikov, Doherty Power Amplifier Architecture, Power Amplifier Design for Communication Systems, pp. 372-381, Chapter 9.
Wicks, et al., A 60-GHz Fully Integrated Doherty Power Amplifier Based on 0.13-mm CMOS Process, IEEE Radio Frequency Integrated Circuits Symposium, 2008, pp. 69-72.
Tsai, et al., A 38-46 GHz MMIC Doherty Power Amplifier Using Post-Distortion Linearization, IEEE Microwave and Wireless Components Letters, 2007, pp. 388-390, vol. 17, No. 5.

* cited by examiner

*Primary Examiner* — Khanh Nguyen
(74) *Attorney, Agent, or Firm* — Haynes and Boone, LLP

(57) ABSTRACT

A wireless communications system includes a first multiplexer distribution network fed by a radio frequency input; a plurality of multi-stage power amplifiers fed by the first multiplexer distribution network, wherein each one of the multi-stage power amplifiers includes: a pre-distortion linearizer fed from the first distribution network; a first combiner receiving input from the pre-distortion linearizer; a second combiner; a plurality of power amplifier cells fed by the first combiner and feeding the second combiner; and a second multiplexer distribution network, wherein the second multiplexer distribution network is fed by the second combiner and feeds a radio frequency output.

14 Claims, 13 Drawing Sheets

V-BAND HIGH-POWER TRANSMITTER WITH INTEGRATED POWER COMBINER

CROSS REFERENCE TO RELATED APPLICATIONS

This application claims the benefit of U.S. Provisional Application No. 61/245,106, filed Sep. 23, 2009, which is incorporated by reference.

BACKGROUND

The present disclosure generally relates to millimeter-wave and microwave communications and, more particularly, to power combining for solid state power amplifiers implemented with monolithic microwave integrated circuit (MMIC) technology.

Commercial and military satellite communication systems may look to achieve higher signal capacities by employing complex modulation schemes in channels that are closely spaced in frequency. Nonlinearities in the wireless communication links, particularly power amplifiers, can cause spectral re-growth, wherein extraneous power from one channel interferes with signals from adjacent channels. Adjacent channel interference adversely affects communication data rates and reliability.

Thus, there is a need in the art for technology to minimize adjacent channel interference while increasing overall transmission power in the design and implementation of millimeter wave broadband power amplifiers.

SUMMARY

According to one embodiment, a wireless communications system includes, a first multiplexer distribution network fed by a radio frequency input; a plurality of multi-stage broadband power amplifiers fed by the first multiplexer distribution network, wherein each one of the multi-stage broadband power amplifiers includes: a pre-distortion linearizer fed from the first distribution network; a first combiner receiving input from the pre-distortion linearizer; a second combiner; a plurality of power amplifier cells fed by the first combiner and feeding the second combiner; and a second multiplexer distribution network, wherein the second multiplexer distribution network is fed by the second combiner and feeds a radio frequency output.

According to another embodiment, a solid state power amplifier includes: a splitting network having an input and plurality of outputs, wherein each splitting network output is selective of a channel of a full bandwidth; a plurality of pre-distortion linearizers each fed through one of a plurality of drivers from one output of the splitting network; a divider fed from one of the pre-distortion linearizers; a power amplifier fed from the divider and comprising a carrier amplifier and a peaking amplifier connected in a Doherty configuration, wherein the carrier amplifier is configured to operate in class B/AB and the peaking amplifier is configured to operate in class C; a combiner fed from the power amplifier; and a combining network having an input fed from the combiner, the combining network having a plurality of inputs and configured to combine signal power from the plurality of channels input into a signal output comprising the full bandwidth.

According to another embodiment, a method of amplifying a wideband radio frequency signal includes: splitting the radio frequency signal to a plurality of narrow band pre-distortion linearizers; pre-distorting the radio frequency signal to create a gain expansion inverse to a compression point in a power amplifier; splitting the pre-distorted signal among a plurality of microwave power amplifiers; amplifying the split signal using a carrier amplifier and peaking amplifier transistor pair; combining the amplified signal using one of a plurality of combiners; and combining signals output from the plurality of combiners into an output signal.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Figure 1:
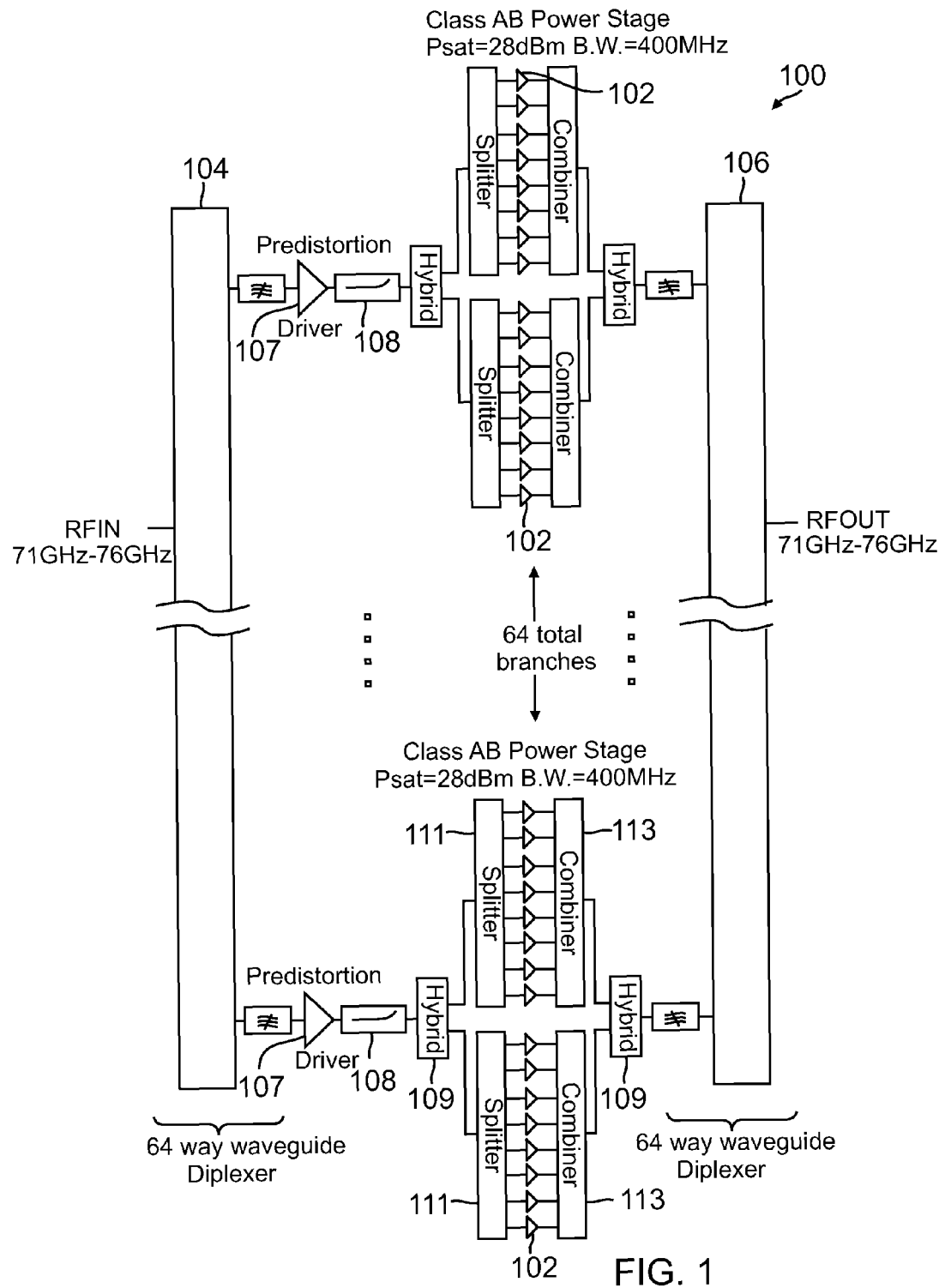
FIG. 1 is a system block diagram showing a combination of types of power combining for implementing a microwave power amplifier in accordance with one embodiment of the present invention.

In accordance with one or more embodiments of the present invention, systems and methods disclosed herein provide for microwave power amplification using power combining in an array of solid state power amplifiers (SSPA) to provide an effective output power such as 30 watts (W) in a frequency range of about 71-76 Giga Hertz (GHz). Due to its narrowband of operation, switching power amplifiers with efficiency of better than 45% at 76 GHz may also be used. A more compact array size may be achieved, although the array size may generally be constrained by the frequency of operation and the size of the corporate adders due to the transistor size being small in comparison to the size of the passive devices. The entire SSPA array may be monolithic and may be implemented using monolithic microwave integrated circuit (MMIC) process, with the combiner being manufactured by micro-machining. Such an array configuration—implementing at once both power and frequency combining—for a broadband microwave power amplifier reduces adjacent channel interference that adversely affects communications data rates, and thus can improve satellite communications as well as the performance of other communication systems that use portions of the microwave spectrum.

In a more conventional approach of distributing the input signal power with, for example, 5 GHz bandwidth into an array without altering the pass band frequency bandwidth, the full bandwidth of the input signal may be fed to a corporate divider at each branch. All branches may be designed identically with each linearizer operating over the entire 5 GHz bandwidth at each amplifier (cell of the array). This approach provides several system benefits such as identical design for all the branches of divider network, combiner network, and power amplifier cells. This approach, however, may complicate the process of hardware design, especially in using narrowband, efficiency-enhancement power cell methods, e.g., for Doherty power amplifiers and the pre-distortion linearizer circuits.

In the approach, according to one or more embodiments, of distributing the input power with channelized pass band frequency—i.e., frequency as well as power combining—the input signal (with, for example, 5 GHz bandwidth) may be fed to an input splitter 104 (e.g., first distribution network 104, see FIG. 1) configured as a multiplexer (also referred to as filtered corporate combining) to provide output of 64 branches, each, for example, 80 MHz wide (which may include some overlap between adjacent channels). The very narrow, channelized band (e.g., 80 MHz) of frequency may facilitate the design of power cells 102 that can be highly linearized, using, for example, Doherty power amplifier configuration and the pre-distortion circuit.

Also, using this channelized approach, all branches of the input splitter 111 (and, likewise, output combiner 113) may be identical, and in case one power amplifier 102 malfunctions, SSPA 100 can continue to perform acceptably with minimal loss in power. At the same time, i.e., in event of a total channel power amplifier failure, channel switching can circumvent the problem at system level. If a vector modulation like 16-QAM (quadrature amplitude modulation) is the modulation of choice, phase and amplitude of the waveforms may be required to be intact even after being split and recombined between two adjacent branches. Thus, the multiplexers 104, 106 may be designed in a way to guarantee phase and level integrity of the signals; in other words, the multiplexers 104, 106 may be seamless at transitions. In order to guarantee phase and level integrity of the signals, a one to 64 multiplexer combiner, e.g., multiplexers 104, 106, may divide the 5 GHz, for example, bandwidth into 64 channels each 80 MHz wide. The filtered corporate combining may provide 18 dB of combining gain at this stage of SSPA 100. Assuming that the communication channels distribute arbitrarily over the for example, 5 GHz bandwidth, then SSPA 100 may be required to maintain phase and gain integrity (e.g., for 16-QAM modulation) while transitioning from one channel to the other.

FIG. 1 is a system block diagram for an SSPA power combining switching amplifier array 100 (also referred to as SSPA 100) in accordance with one or more embodiments. The SSPA 100 shown in FIG. 1 may be a planar array of power amplifier elements 102 (also referred to as cells 102 or power amplifiers 102). The integrated array in a monolithic substrate requires distribution networks 104 to bring power, and distribute radio frequency (RF) signals (e.g., a microwave input signal) from a central point (e.g. an RF input) to every power amplifier element 102 in the array, and combine the signals into a single signal output using a waveguide combiner 106. Consideration may be given to the element level electronics, the inter-element connections, external interfaces, packaging, and the operation of the entire tile (array) of power amplifiers 102.

In order to provide a nominal goal of 45 dBm (decibels referenced to one millliwatt) of output power, several power cells 102 may be arranged in tandem. To attain a tandem arrangement, a combination of balanced and corporate power combining for cells 102 may be employed. Referring to FIG. 1, for example, a single power cell 102 of maximum output power 20 dBm may be multiplied by 1024 (64×16) to attain the required power level of about 45 dBm after deducting the implementation loss of the combiner network, e.g., splitting (or divider) network 104 and combiner network 106 (also referred to as first and second distribution networks). At each of the 64, for example, branches shown in FIG. 1, one or more splitters 111 may operate as a splitter or divider to distribute signal to each of, in this example, 16 power amplifiers 102 and the output of the 16 power amplifiers 102 may be combined by one or more combiners 113. Splitters 111 and combiners 113 may be connected at their respective inputs and outputs feeding from (to) distribution networks 104, 106 by hybrid couplers 109 as seen in FIG. 1. In order to reduce the combining loss, a system of waveguide-based combiner in conjunction with the planar balanced and corporate power combining may be used. Waveguide-based combining may provide high quality factor filter as well as a low loss transmission environment.

Figure 2A:
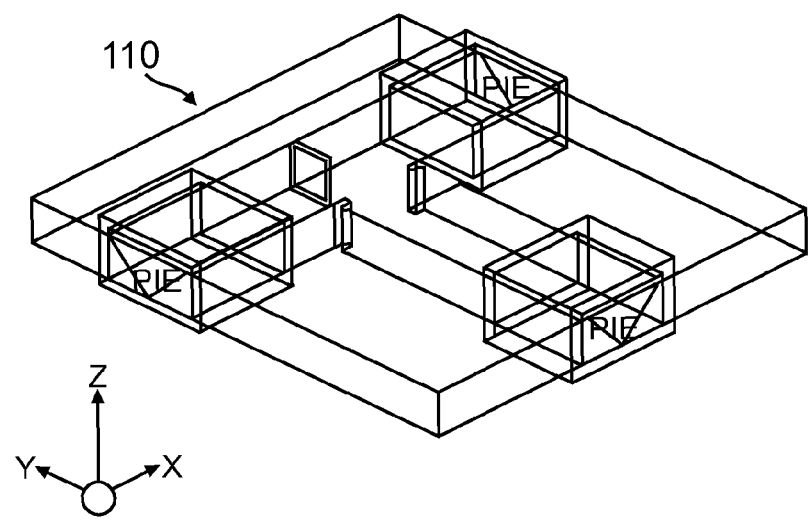
FIG. 2A is an isometric view of a waveguide divider core element in accordance with an embodiment.
Figure 2B:
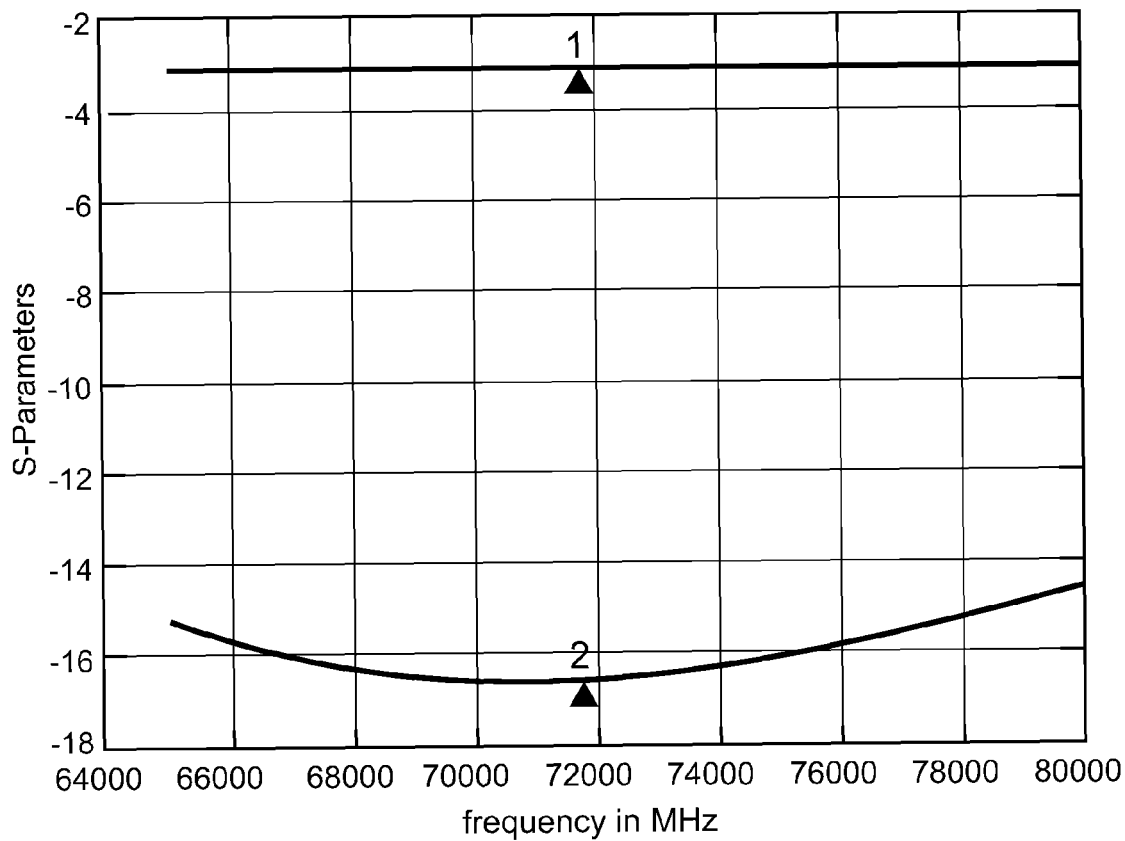
FIG. 2B is a frequency graph illustrating S-parameters for the element shown in FIG. 2A.

FIG. 2A is an isometric view of a waveguide divider core element 110 in accordance with one embodiment, and FIG. 2B is a frequency graph illustrating S11 parameters for the core element 110. In order to reduce the combining loss, a waveguide network may be used to implement the first splitting 104 and combining 106 network. FIG. 2A shows a core element 110 of such an arrangement. The same core element 110 may be used as a divider or a diplexer. FIG. 2B depicts the S11 characteristics of the diplexer over the entire 71-76 GHz frequency range.

Figure 3A:
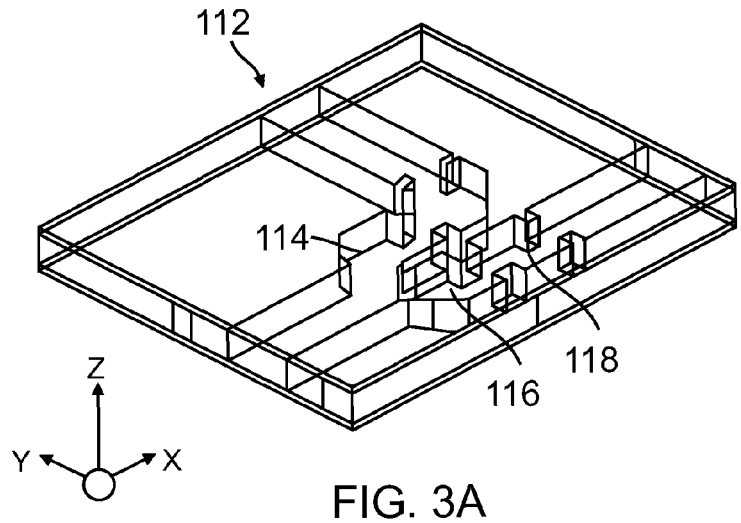
FIG. 3A is modified waveguide divider core element in accordance with another embodiment.
Figure 3B:
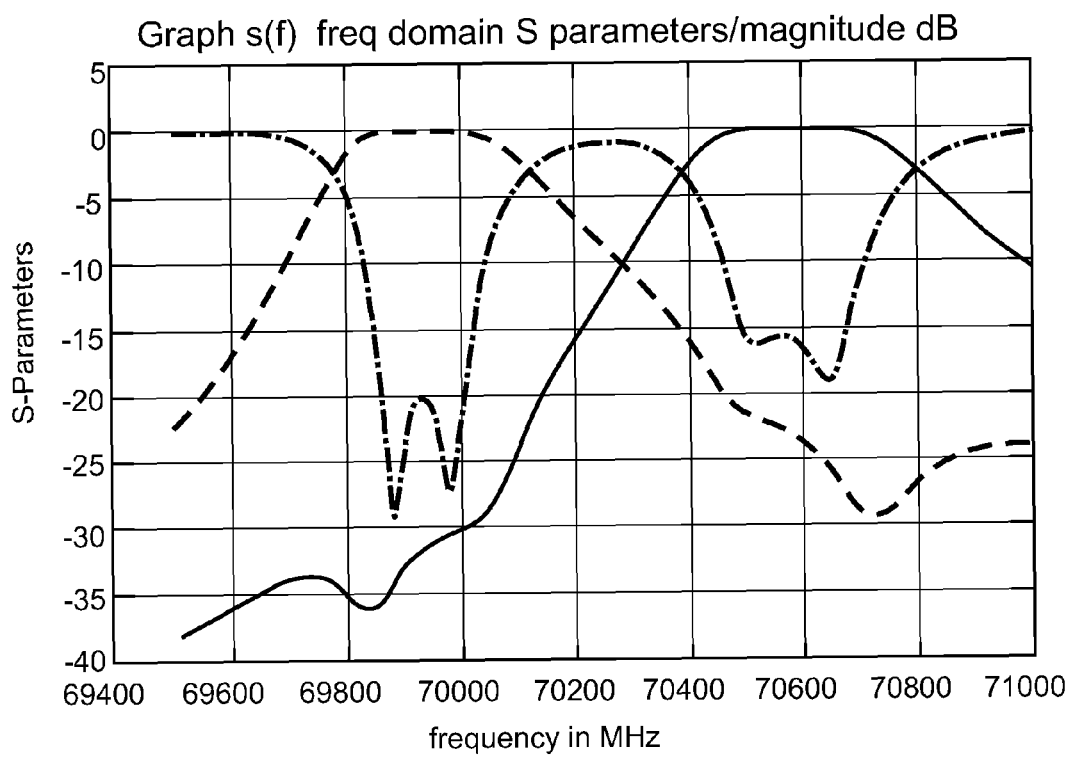
FIG. 3B is a frequency graph illustrating S-parameters for the element shown in FIG. 3A.

As shown in FIG. 3A, for implementation of a diplexer for splitting and combining networks 104, 106, a modified core element 112 may introduce cavities—such as cavities 114, 116, and 118—to provide filtering of the channels at different frequency responses for adjacent branches. FIG. 3B is a frequency graph illustrating S11 parameters for the modified core element 112.

The power amplifier (e.g., cells 102) with a pre-distortion network implementation may be highly linear when operated close to its Psat (e.g., power saturation point) which means higher power-added efficiency. At the same time, required high efficiency implies that a class A amplifier is not a suitable choice. A Class AB amplifier biased closer to class B, however, and used in conjunction with a class C amplifier (e.g., in a Doherty arrangement) may provide a combination of higher efficiency and acceptable linearity. Implementing a class AB power amplifier cell 102 may be achieved by channelizing the entire, for example, 5 GHz bandwidth into smaller bands and then combining them to reproduce the original 5 GHz band of interest.

Figure 4A:
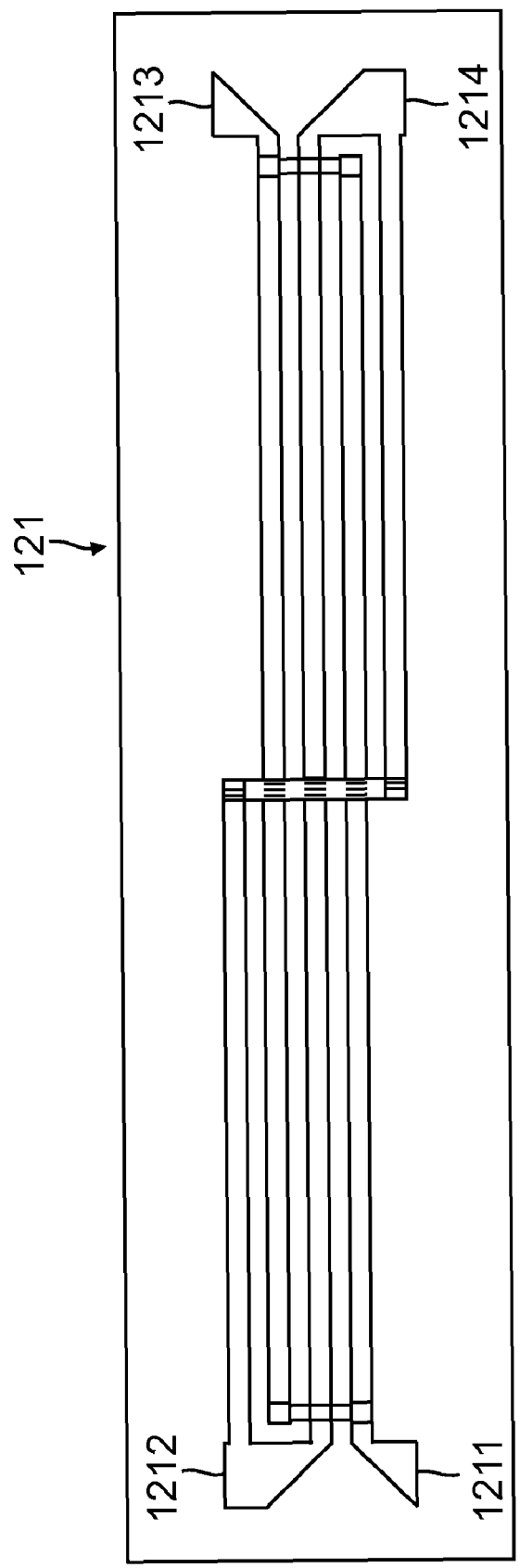
FIG. 4A is a diagram illustrating a four-finger Lange coupler in accordance with an embodiment.

FIG. 4A illustrates the layout of a four-finger Lange coupler 121. For example, Lange coupler 121 may be a 4-finger, 4-port Lange hybrid centered at 73 GHz. For Lange coupler 121, if the top left port 1212 is the input (m1 in FIGS. 4B and 4C), the bottom left port 1211 is the "coupled" port (m2 in FIGS. 4B and 4C), the bottom right port 1214 is the "through" port (m4 in FIGS. 4B and 4C), and the top right port 1213 is the "isolated" port (m3 in FIGS. 4B and 4C). When the isolated port 1213 is terminated in 50 ohms, the Lange coupler 121 provides two equal coupled and straight outputs 1211, 1214 (3 dB loss) with 90 degrees phase shift.

Figure 4B:
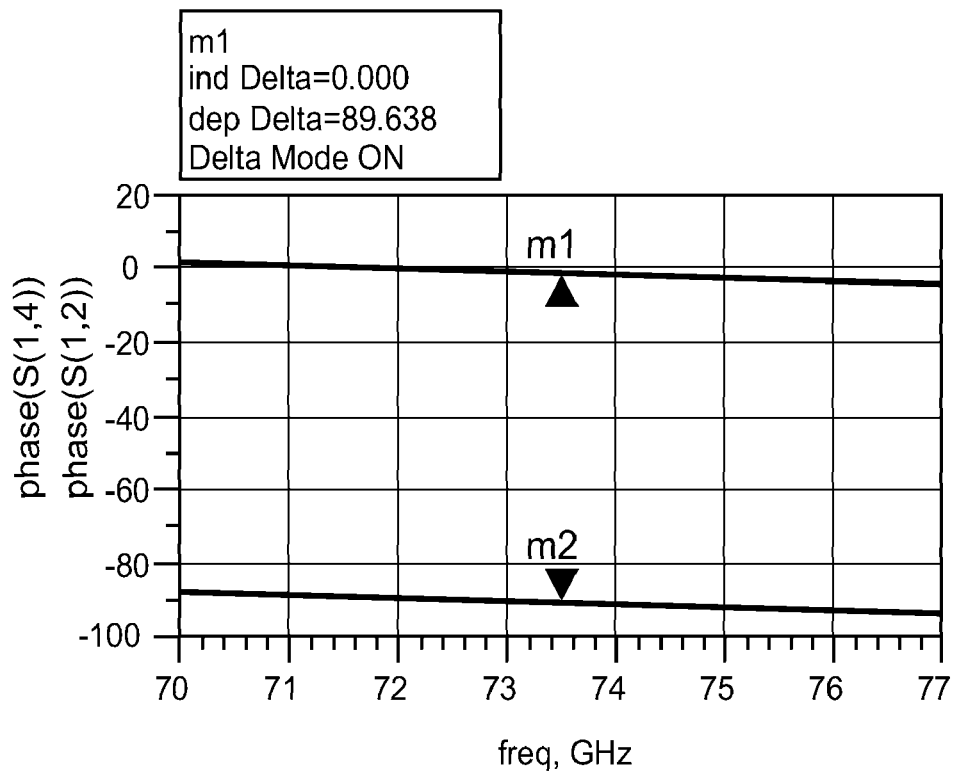
FIGS. 4B and 4C are frequency graphs showing, respectively, phase and gain for the Lange coupler shown in FIG. 4A.
Figure 4C:
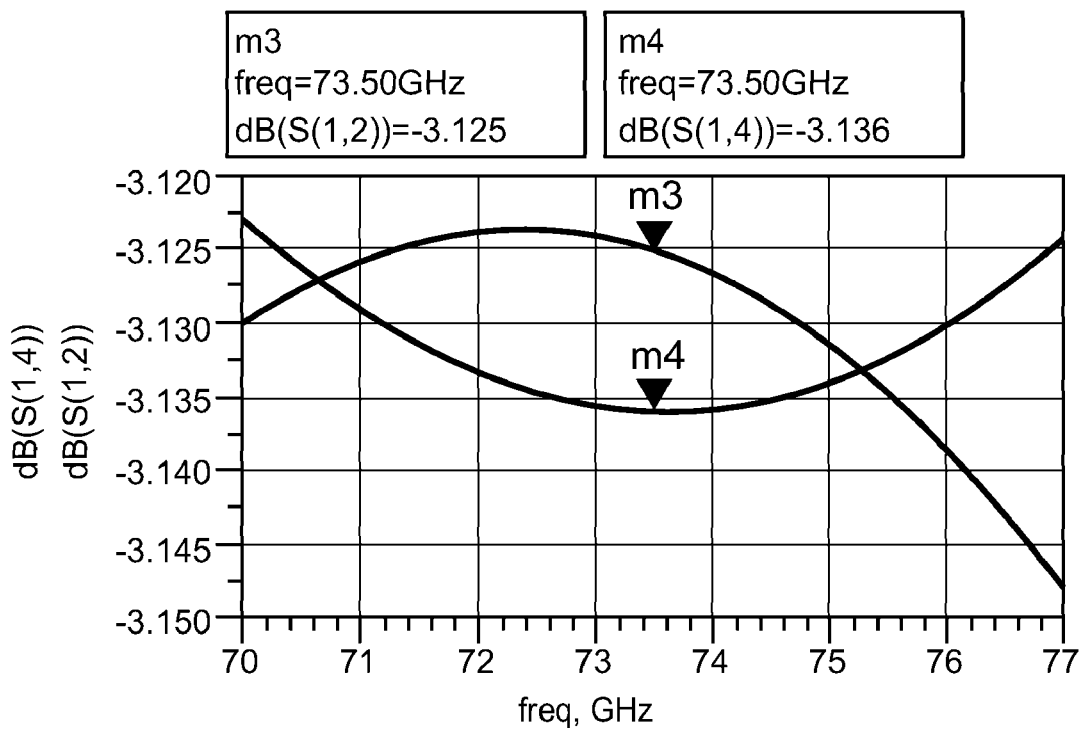

FIGS. 4B and 4C are frequency graphs showing phase shift and insertion loss between two coupled and straight paths from port 1212 (m1) being the input of the Lange coupler 121.

Figure 5A:
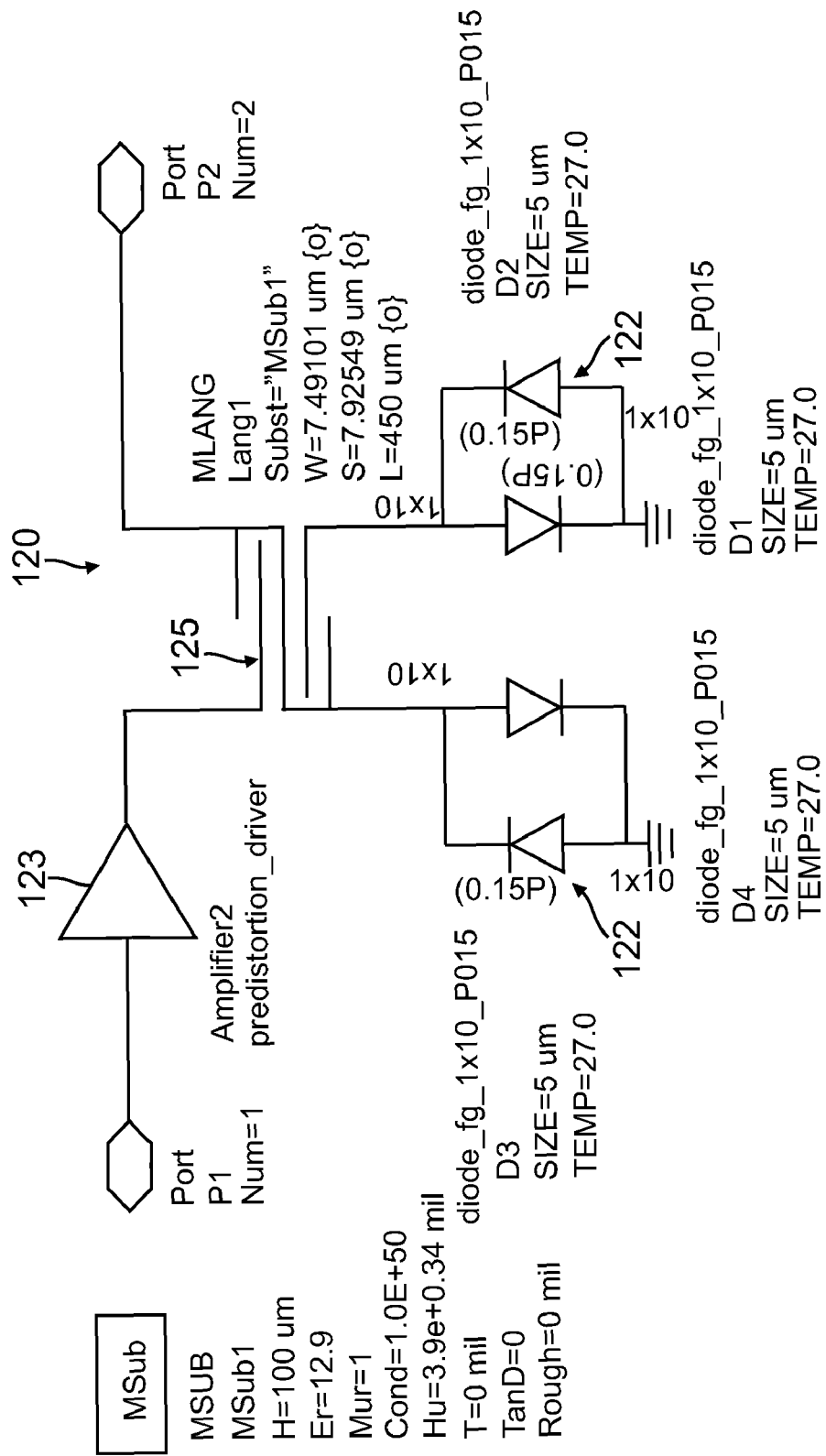
FIG. 5A is a circuit diagram showing a nonlinear core of a pre-distorter in accordance with an embodiment.

FIG. 5A is a schematic diagram showing a nonlinear core of a pre-distorter 120 (included, for example, in pre-distortion linearizer 108). Pre-distorter 120 is a through nonlinearity generator. By using one 90-degree coupler, the reflective nonlinearity happening at the back to back diodes 122 is converted into a through or transmission nonlinearity. The effect may be a gain compression (S21) as a function of the input power. The reason to have an antiparallel diode pair 122 as the nonlinear element is to cancel out the nonlinearities of even order, mostly to target the third and fifth order nonlinearity. The amplifier 123 provides enough gain to drive the diodes 122 into the nonlinear region which eventually demonstrates as the gain compression in S21. The Lange coupler 125 may be a Lange coupler such as Lange coupler 121 described above with reference to FIGS. 4A, 4B, and 4C.

By using a nonlinearity of signal gain before the power amplifier 102 in a method of analog pre-distortion (e.g., feeding the signal through pre-distortion linearizers 108 including pre-distorters 120), the gain compression effect of the power amplifier 102 may be compensated. Different semiconductor devices generally present different nonlinear behaviors. One approach is to choose the same process for the pre-distorter 120 as the power amplifier 102. For example, simulations and evaluations may be based on a GaAs power pHEMT (pseudomorphic high electron mobility transistor) process. FIG. 5A shows a nonlinear core of a pre-distorter 120 comprised of two pairs of parallel reversed diodes 122 chosen from a pHEMT process. The configuration generates an odd order nonlinearity which may be suitable for third and fifth order linearization efforts.

Figure 5B:
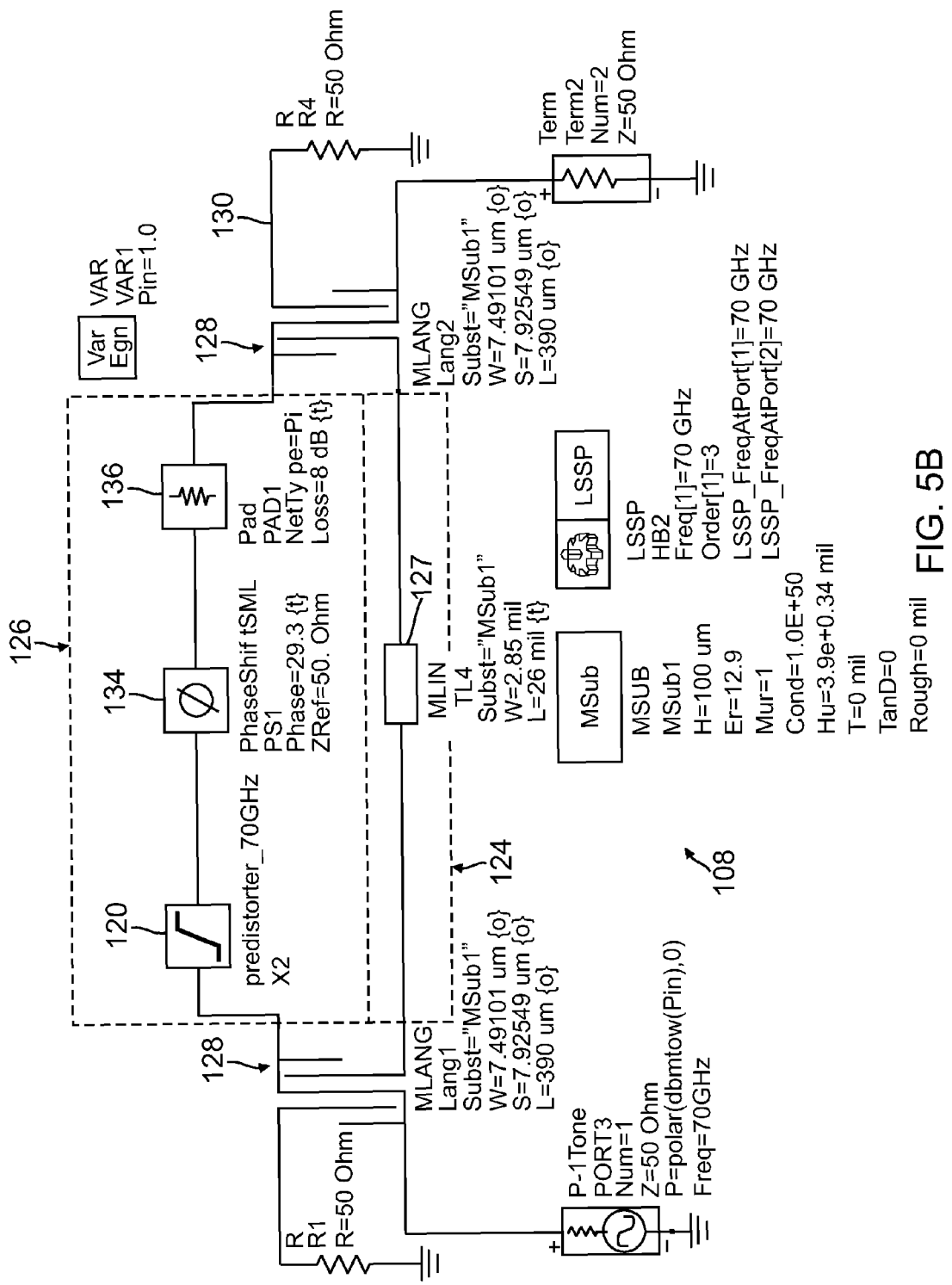
FIG. 5B is a circuit diagram showing a pre-distortion linearizer in accordance with an embodiment.

FIG. 5B shows a pre-distortion linearizer 108 that may create a gain expansion inverse to the compression point in the power amplifier 102. Predistorter 108 includes two paths 124 and 126. A nonlinear path 126 includes the nonlinearity generator (pre-distorter) 120, attenuator 136 and phase shifter 134. A linear path 124, which is a transmission line 127, for example, a micro-strip transmission line. Micro-strip transmission line 127 provides the same phase shift as the nonlinear path 126 of the predistorter 120 while in the linear region with the phase shifter 134 and attenuator 136 in mid range. When this condition is met, there is maximum control over the gain and phase expansion characteristics (see FIG. 6) over the range of the phase shifter 134 and attenuator 136.

Figure 6:
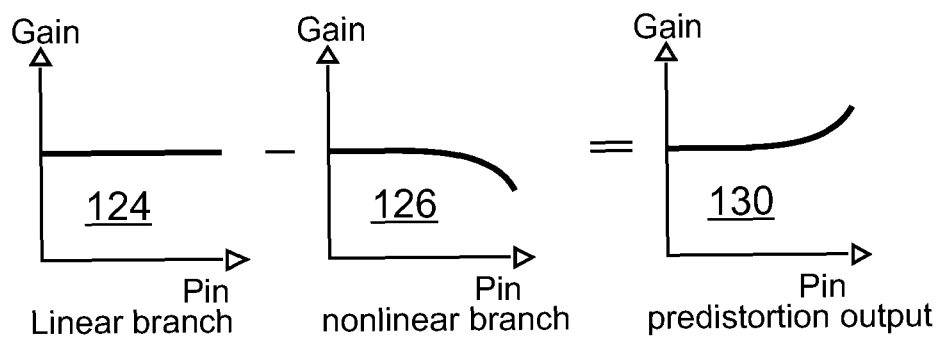
FIG. 6 is a graphical diagram depicting gain expansion at a pre-distortion linearizer, such as that illustrated by FIG. 5, in accordance with an embodiment.

As is shown in FIG. 5B, the input signal may pass through a phase compensating transmission line 124 (lower branch 124) without any compression and then at the upper branch 126 the signal gets compressed by the pre-distorter 120. The compressed signal may go through two 90 degrees hybrids (e.g., Lange couplers 128, which may be Lange couplers such as Lange coupler 121 described above with reference to FIGS. 4A, 4B, and 4C), and with adjusting the attenuator 136 and the phase shifter 134 the compressed version of the signal (e.g. upper branch 126) may be subtracted from the linear version of the signal (e.g., lower branch 124) and generate a gain expansion 130 (e.g., at pre-distortion linearizer output 130) as shown in FIG. 6.

Figure 7A:
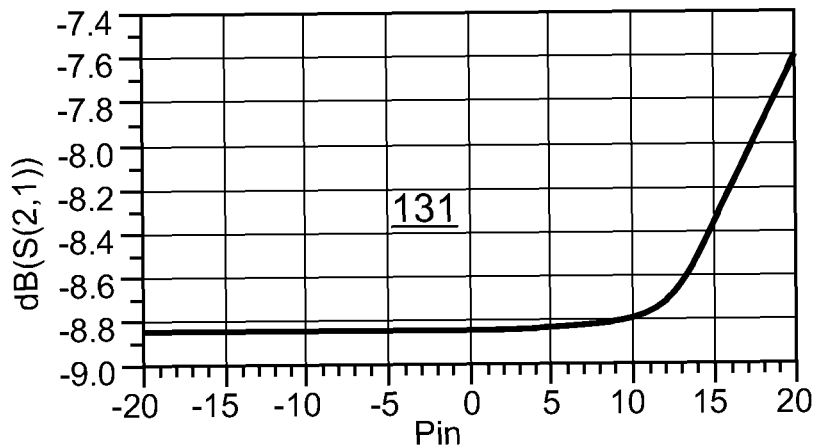
FIGS. 7A and 7B are input power graphs illustrating, respectively, amplitude and phase components of a gain expansion of a linearizer, such as that illustrated by FIG. 5, in accordance with an embodiment.
Figure 7B:
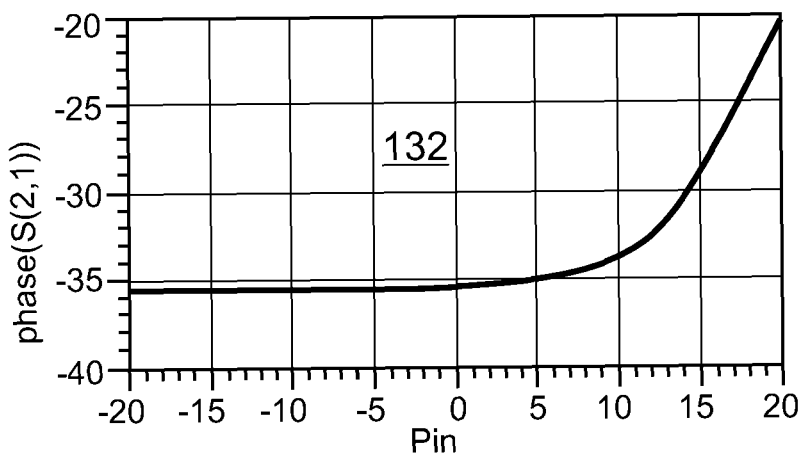

The schematic in FIG. 5B uses the diode and actual designed hybrids to create the gain expansion 130 as seen in FIGS. 7A and 7B, having amplitude component 131 shown in FIG. 7A and phase component 132 shown in FIG. 7B. To be as effective as possible, pre-distortion should address both gain offset distortion—also referred to as amplitude-to-amplitude modulation (AM/AM)—and phase distortion—also referred to as amplitude-to-phase modulation (AM/PM). The phase shifter 134 and the attenuator 136 may be adjusted at the same time. Beside the limited improvement (mostly due to its open loop operation) that RF pre-distortion provides, another shortcoming of RF pre-distortion in general is the narrow band of operation over which it is effective. Both AM/AM and AM/PM may be compensated by first dividing the pass band bandwidth (e.g., 5 GHz) into smaller sub-bands and then using Doherty based amplifiers for power cells 102. FIGS. 7A and 7B indicate phase (FIG. 7B) and gain (FIG. 7A) expansion of the schematic shown in FIG. 5 for a pre-distortion linearizer 108.

Figure 8:
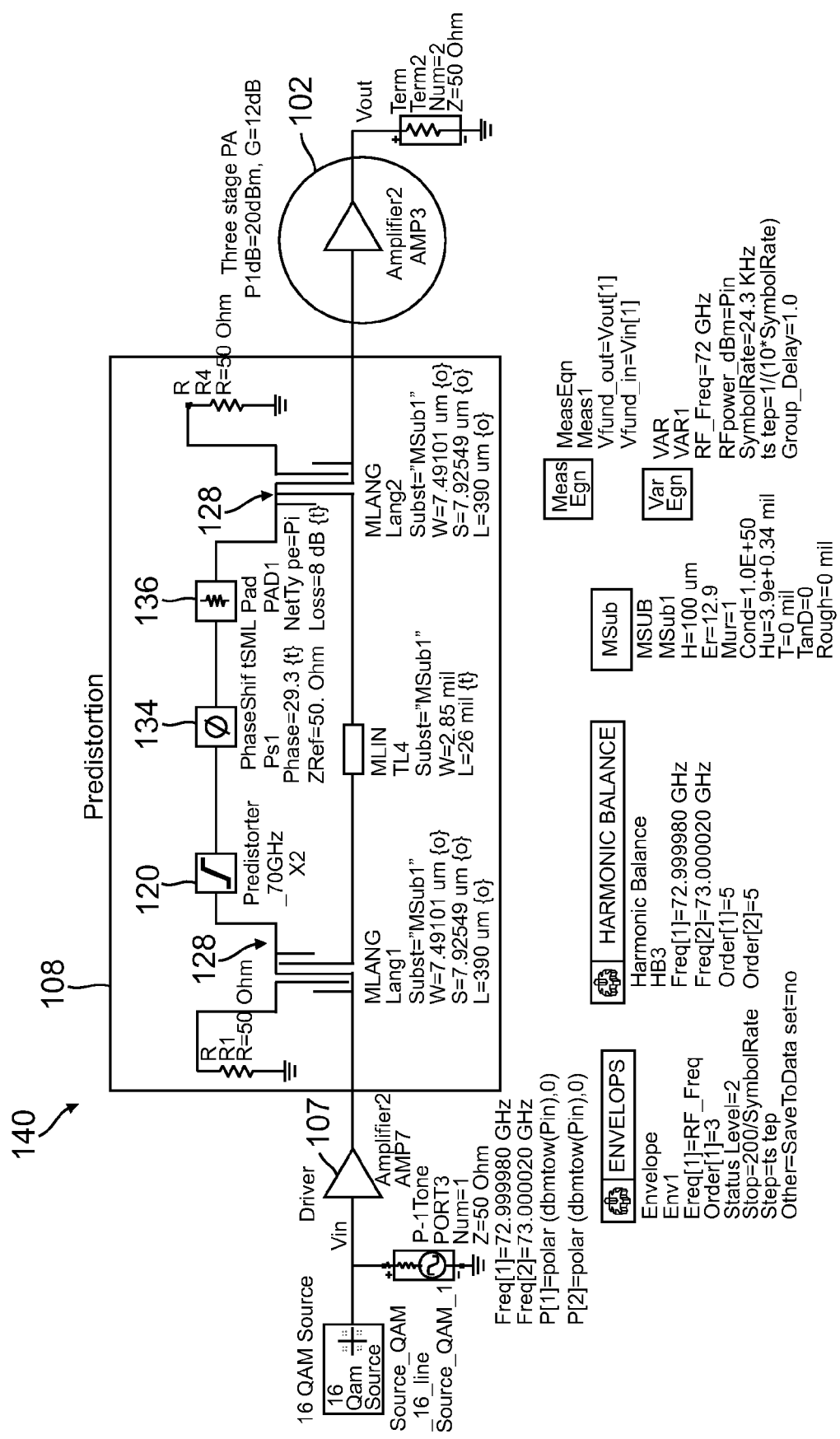
FIG. 8 is a circuit block diagram illustrating the connection of a pre-distortion linearizer, such as that illustrated by FIG. 5, with a three-stage power amplifier, such as those illustrated in FIG. 1, in accordance with an embodiment.
Figure 9:
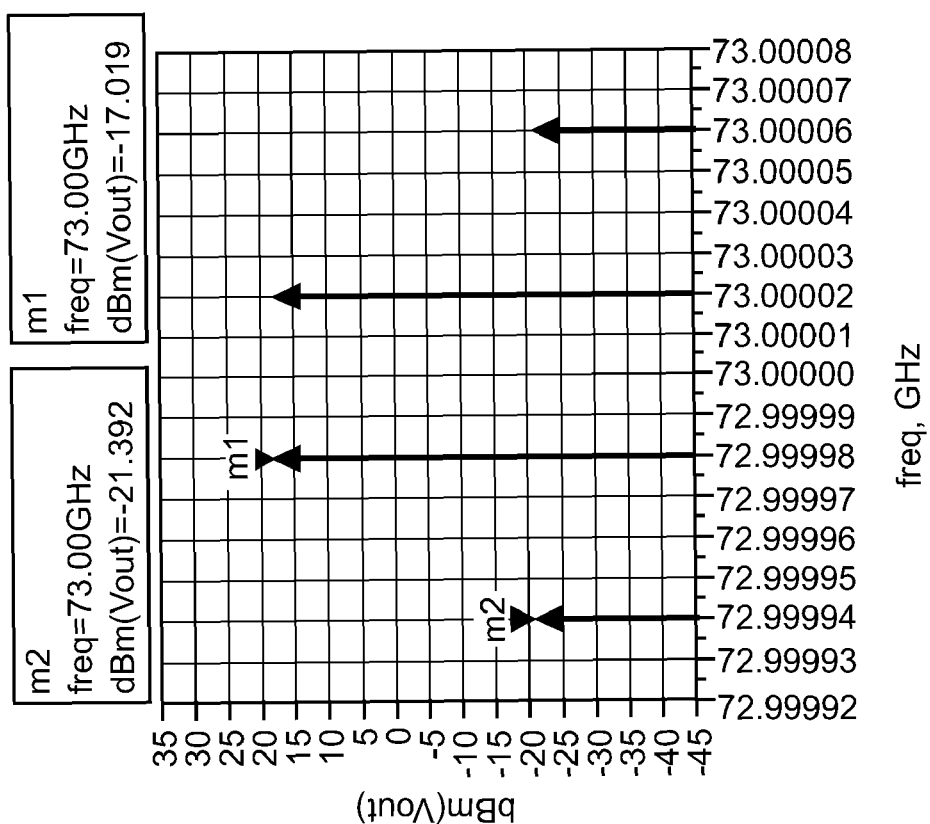
FIG. 9 is a before and after pair of frequency graphs comparing two-tone third-order intermodulation distortion (IMD3) measurement for a microwave power amplifier, such as that illustrated in FIG. 1, before and after tuning a pre-distortion linearizer, such as that illustrated by FIG. 5, in accordance with an embodiment.
Figure 9:
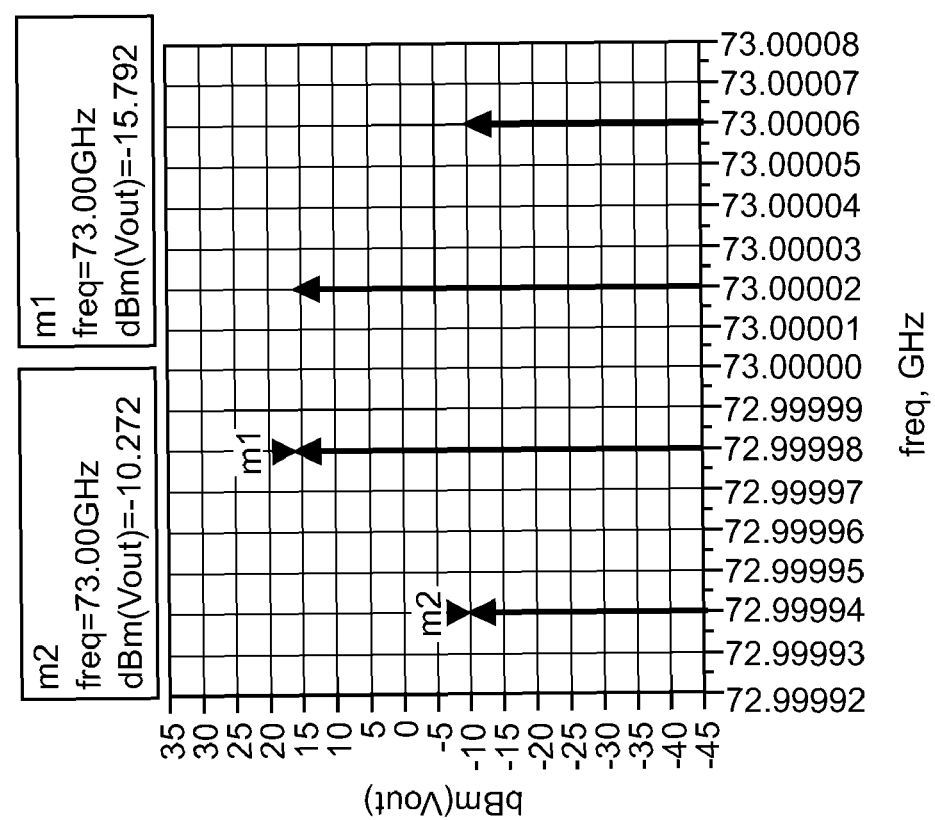
Figure 10:
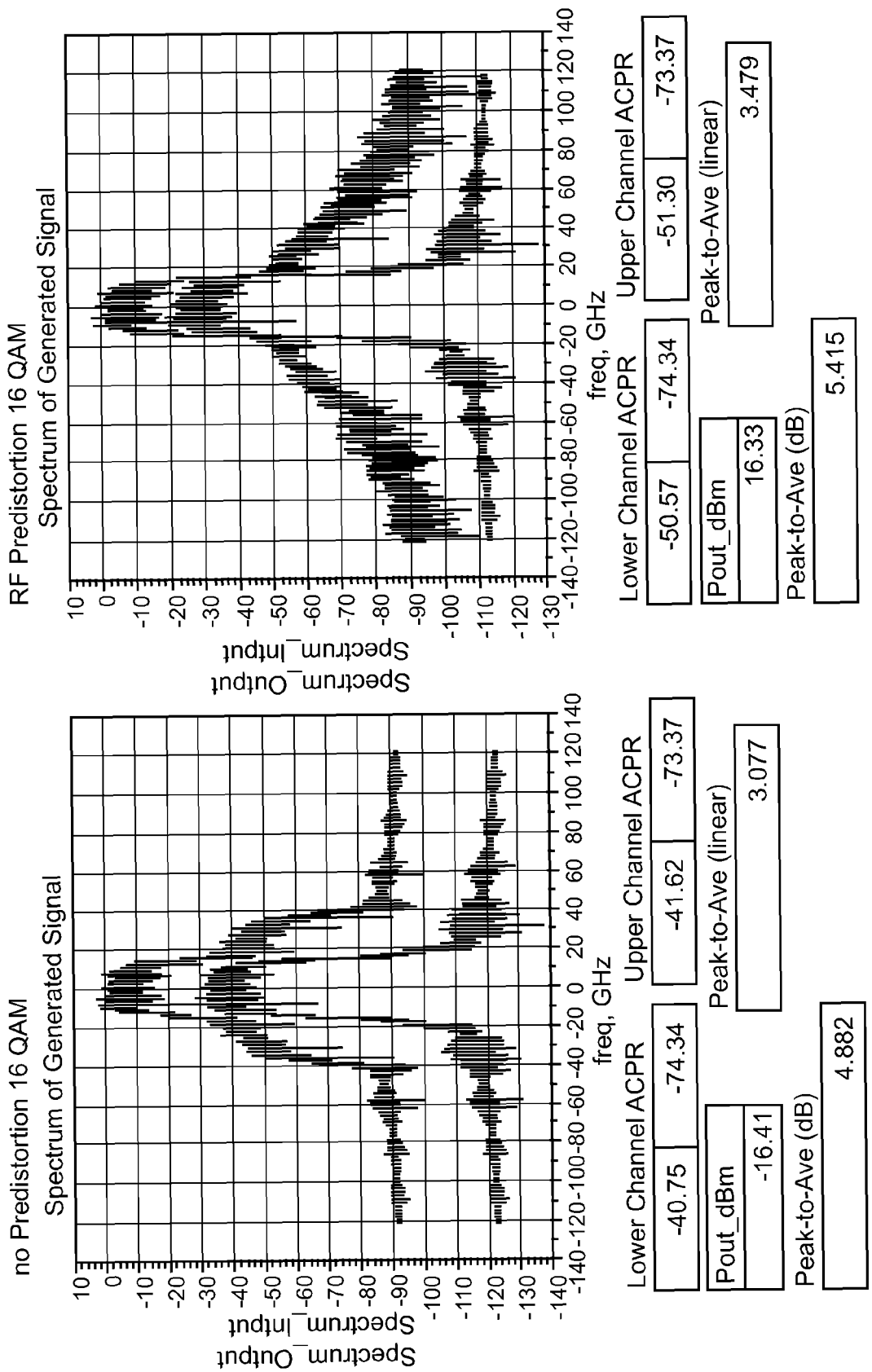
FIG. 10 is a before and after pair of frequency graphs comparing spectrum input versus output for a 16-QAM channel before and after pre-distortion linearization, in accordance with an embodiment.

FIG. 8 shows a three stage power amplifier 140 including a driver 107 feeding a pre-distortion linearizer 108 preceding a power amplifier 102. After tuning the phase shifter 134 and the attenuator of the pre-distortion linearizer 108, an improvement, as shown in FIG. 9, of at least approximately 13 dB in two-tone third-order intermodulation distortion (IMD3) measurement may be observed in a two-tone setup. In a similar simulation, a single 16-QAM waveform is introduced to the input of the three stage amplifier 140, and as shown in FIG. 10, before and after tuning, an adjacent channel power ratio (ACPR) improvement of 10 dB may be observed.

Figure 11:
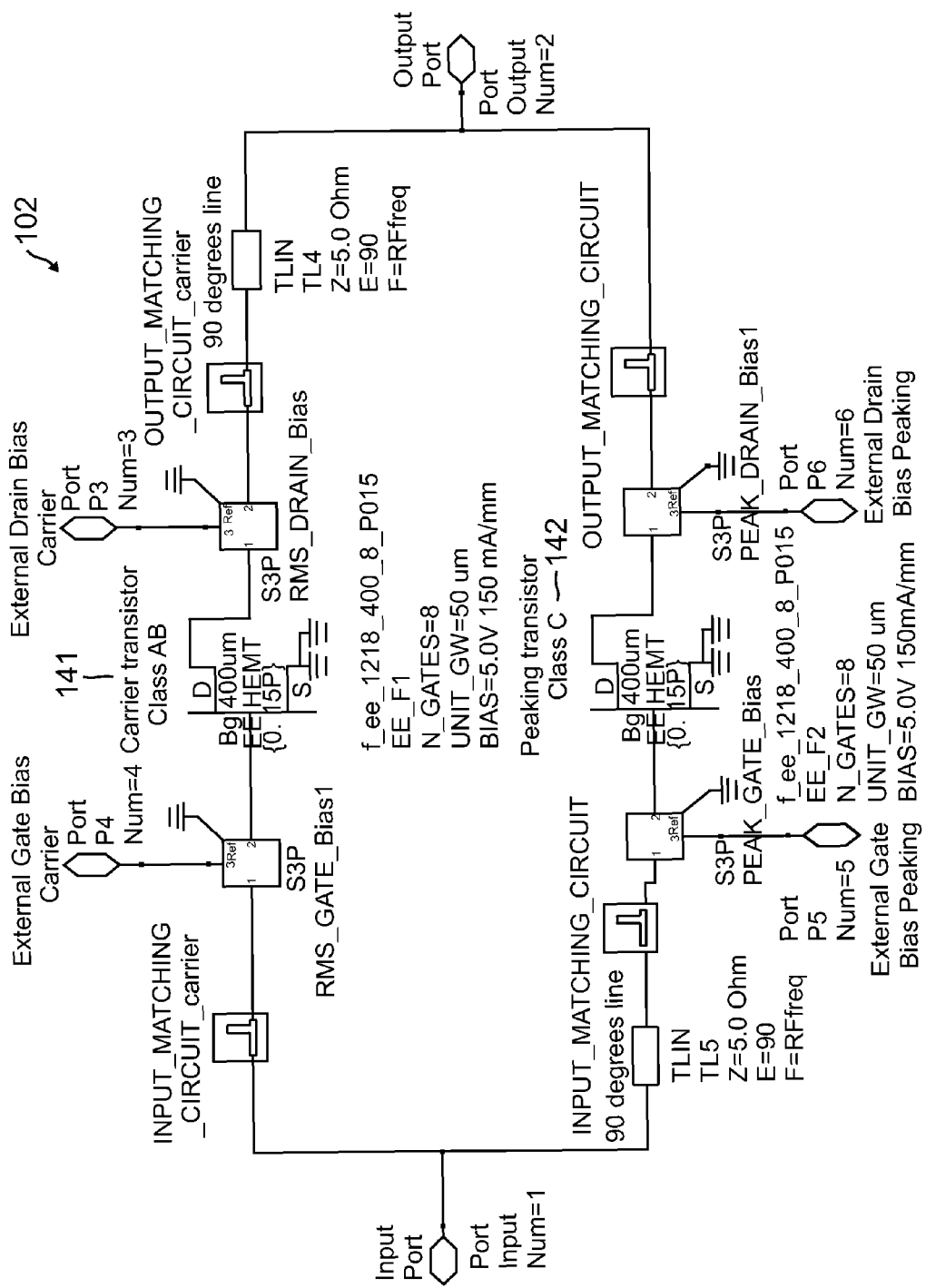
FIG. 11 is a circuit diagram illustrating a power amplification stage of a microwave power amplifier, in accordance with an embodiment.

FIG. 11 is a circuit diagram for a microwave power amplifier 102 employing a Doherty transistor pair. The upper (carrier) transistor 141 is operated in class B/AB while the lower (peaking) transistor 142 is biased at class C. The prototypical Doherty power cell and most of the low frequency implementations of Doherty power cells bias the carrier transistor at class B, but at higher microwave bands, however, the available gain is reduced and using a class B bias might not offer enough gain, so a compromise between gain and bias (the tradeoff being determined by how deep in class AB the carrier transistor 141 is biased) may be made.

For example, Doherty power amplifiers are extensively used at RF and lower microwave frequencies. The generally highest frequencies at which they are operated are at about 60 GHz (for CMOS 65 nanometers (nm)) and about 45 GHz (for GaAs pHEMT 0.15 um). When using a class B or Class AB power cell, in order to achieve a minimum efficiency of 30% for a 6 dB back off for 16-QAM modulation (the back off would be less if there is a coding) the maximum power efficiency of the power cell should be very high. The extreme example would be using a 100% efficient power cell at its maximum RF power; after 6 dB power back off, the efficiency would yield to merely 25%. One solution to circumvent these conflicting requirements is to use an efficiency enhancement method for the power cell. Thus, FIG. 11 shows a Doherty transistor pair 141, 142 that comprises a class B/AB carrier amplifier (transistor 141) which manages enhancing the average power, and a class C peaking amplifier (transistor 142) which manages the peak power amplifications. Using this configuration the impact of power back off on reducing the efficiency diminishes.

Figure 12:
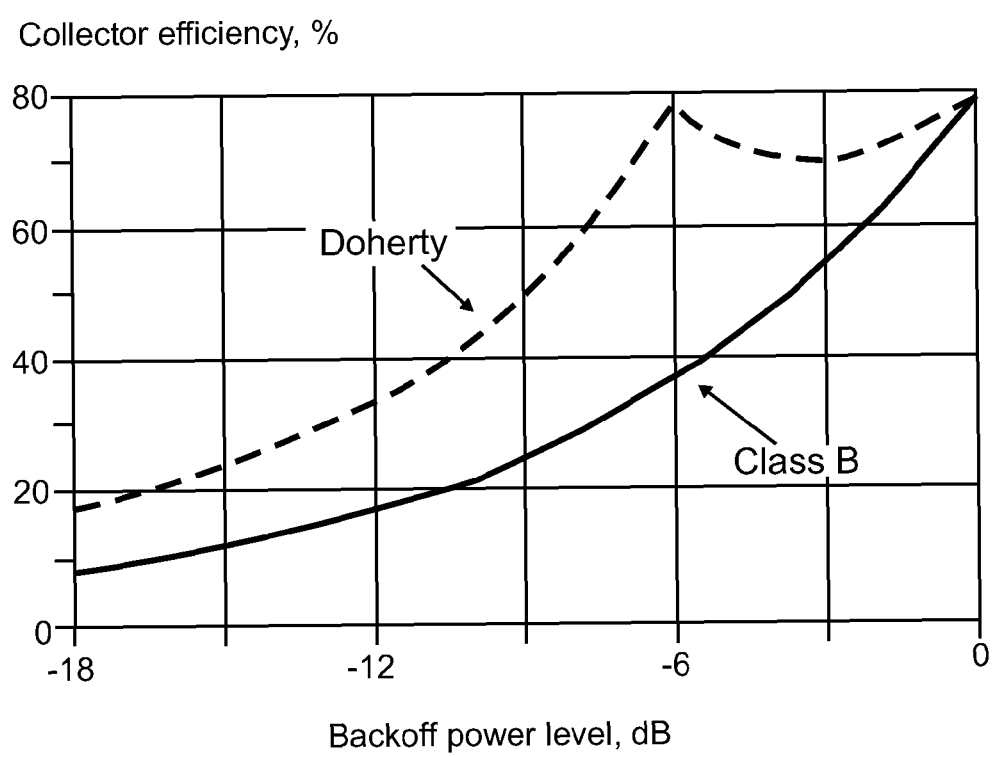
FIG. 12 is a backoff power level graph comparing efficiencies of two different classes of microwave power amplifiers, in accordance with one or more embodiments.

FIG. 12 is a backoff power level graph comparing efficiencies of two different classes of microwave power amplifiers. FIG. 12 shows that even after 6 dB backoff, a class B Doherty pair maintains the same efficiency as an ordinary class B amplifier at maximum power.

Embodiments described herein illustrate but do not limit the disclosure. It should also be understood that numerous modifications and variations are possible in accordance with the principles of the present disclosure. Accordingly, the scope of the disclosure is best defined only by the following claims.

We claim:
1. A wireless communications system comprising:
 a first multiplexer distribution network fed by a radio frequency input;
 a plurality of multi-stage broadband power amplifiers fed by the first multiplexer distribution network, wherein each one of the multi-stage broadband power amplifiers includes:
  a pre-distortion linearizer fed from the first distribution network;
  a splitter receiving input from the pre-distortion linearizer;
  a combiner;
  a plurality of power amplifier cells fed by the splitter and feeding the combiner; and
 a second multiplexer distribution network, wherein the second multiplexer distribution network is fed by the combiner and feeds a radio frequency output.
2. The communications system of claim 1, wherein:
 the pre-distortion linearizer is configured to create a gain expansion inverse to a compression point in each of the power amplifier cells.
3. The communications system of claim 1, wherein each one of the multi-stage broadband power amplifiers includes:
 a driver amplifier configured to receive input from the first multiplexer distribution network and feed the pre-distortion linearizer.
4. The communications system of claim 1, wherein:
 the combiner is an in-phase isolated combiner.
5. The communications system of claim 1, wherein:
 the multi-stage broadband power amplifier includes a Doherty transistor pair.
6. The communications system of claim 1, wherein:
 the multi-stage broadband power amplifier includes an upper transistor of a Doherty transistor pair configured to operate in class B/AB and a lower transistor of the Doherty transistor pair configured to operate in class C.

7. The communications system of claim 1, wherein:
 the first multiplexer distribution network is configured to feed a channelized branch of a full bandwidth to each of the plurality of multi-stage broadband power amplifiers.
8. The communications system of claim 1, wherein:
 the second multiplexer distribution network is configured to receive a channelized branch of a full bandwidth from each of the plurality of multi-stage broadband power amplifiers, wherein the totality of channelized branches comprises the full bandwidth.
9. A solid state power amplifier comprising:
 a splitting network having an input and plurality of outputs, wherein each splitting network output is selective of a channel of a full bandwidth;
 a plurality of pre-distortion linearizers each fed through one of a plurality of drivers from one output of the splitting network;
 a divider fed from one of the pre-distortion linearizers;
 a power amplifier fed from the divider and comprising a carrier amplifier and a peaking amplifier connected in a Doherty configuration, wherein the carrier amplifier is configured to operate in class B/AB and the peaking amplifier is configured to operate in class C;
 a combiner fed from the power amplifier; and
 a combining network having an input fed from the combiner, the combining network having a plurality of inputs and configured to combine signal power from the plurality of channels input into a signal output comprising the full bandwidth.
10. The solid state power amplifier of claim 9, wherein:
 the divider and combiner are in-phase isolated combiner structures.
11. The solid state power amplifier of claim 9, wherein:
 the divider and combiner are balanced combiner structures.
12. A method of amplifying a wideband radio frequency signal, comprising:
 splitting the wideband radio frequency signal to a plurality of narrow band pre-distortion linearizers;
 pre-distorting the radio frequency signal to create a gain expansion inverse to a compression point in a power amplifier;
 splitting the pre-distorted signal among a plurality of power amplifiers;
 amplifying the split signal using a carrier amplifier and peaking amplifier transistor pair;
 combining the amplified signal using one of a plurality of combiners; and
 combining signals output from the plurality of combiners into an output signal.
13. The method of claim 12, wherein:
 the transistor pair is a Doherty transistor pair, and
  the carrier amplifier is operated in class B/AB; and
  the peaking amplifier is operated in class C.
14. The method of claim 12, wherein:
 splitting the wideband radio frequency signal uses multiplexing configured to feed a plurality of channelized branches of the pass band of the wideband radio frequency signal; and
 combining the output signal uses multiplexing configured to feed the plurality of channelized branches of the pass band of the wideband radio frequency signal; and
 the totality of channelized branches comprises a full pass band bandwidth.

* * * * *